(12) United States Patent
Hayakawa et al.

(10) Patent No.: US 7,018,020 B2
(45) Date of Patent: Mar. 28, 2006

(54) STRUCTURE WITH THROUGH HOLE, PRODUCTION METHOD THEREOF, AND LIQUID DISCHARGE HEAD

(75) Inventors: Yukihiro Hayakawa, Kanagawa (JP); Genzo Monma, Kanagawa (JP); Masato Kamiichi, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/270,650

(22) Filed: Oct. 16, 2002

(65) Prior Publication Data
US 2003/0080359 A1 May 1, 2003

(30) Foreign Application Priority Data
Oct. 30, 2001 (JP) .............................. 2001-332548

(51) Int. Cl.
*B41J 2/05* (2006.01)

(52) U.S. Cl. ........................................ 347/63; 257/276
(58) Field of Classification Search .................... 216/2, 216/27, 157; 257/256, 267; 347/63
See application file for complete search history.

(56) References Cited

U.S. PATENT DOCUMENTS

| 5,517,224 A | * | 5/1996 | Kaizu et al. ................... 347/59 |
| 5,658,471 A | * | 8/1997 | Murthy et al. ................. 216/27 |
| 6,143,190 A | * | 11/2000 | Yagi et al. ..................... 216/27 |
| 6,382,775 B1 | * | 5/2002 | Kubota et al. ................. 347/62 |
| 6,450,621 B1 | | 9/2002 | Hayakawa .................... 347/63 |
| 6,467,884 B1 | | 10/2002 | Murooka et al. .............. 347/64 |
| 6,534,247 B1 | * | 3/2003 | Milligan et al. ............ 430/320 |
| 6,685,304 B1 | * | 2/2004 | Miyamoto ..................... 347/63 |

FOREIGN PATENT DOCUMENTS

JP 10-181032 7/1998

* cited by examiner

*Primary Examiner*—David Nelms
*Assistant Examiner*—Dao H. Nguyen
(74) *Attorney, Agent, or Firm*—Fitzpatrick, Cella, Harper & Scinto

(57) ABSTRACT

A structure is constructed having a through hole in a substrate of silicon or the like by a decreased number of steps in production and with improved reliability. A silicon nitride film is formed in contact with an upper surface of a silicon oxide film at least on a portion of the substrate near the edge of a through hole, thereby improving step coverage of the silicon nitride film. The silicon oxide film and silicon nitride film function as a membrane during formation of the through hole by etching from the back side of the substrate.

7 Claims, 11 Drawing Sheets

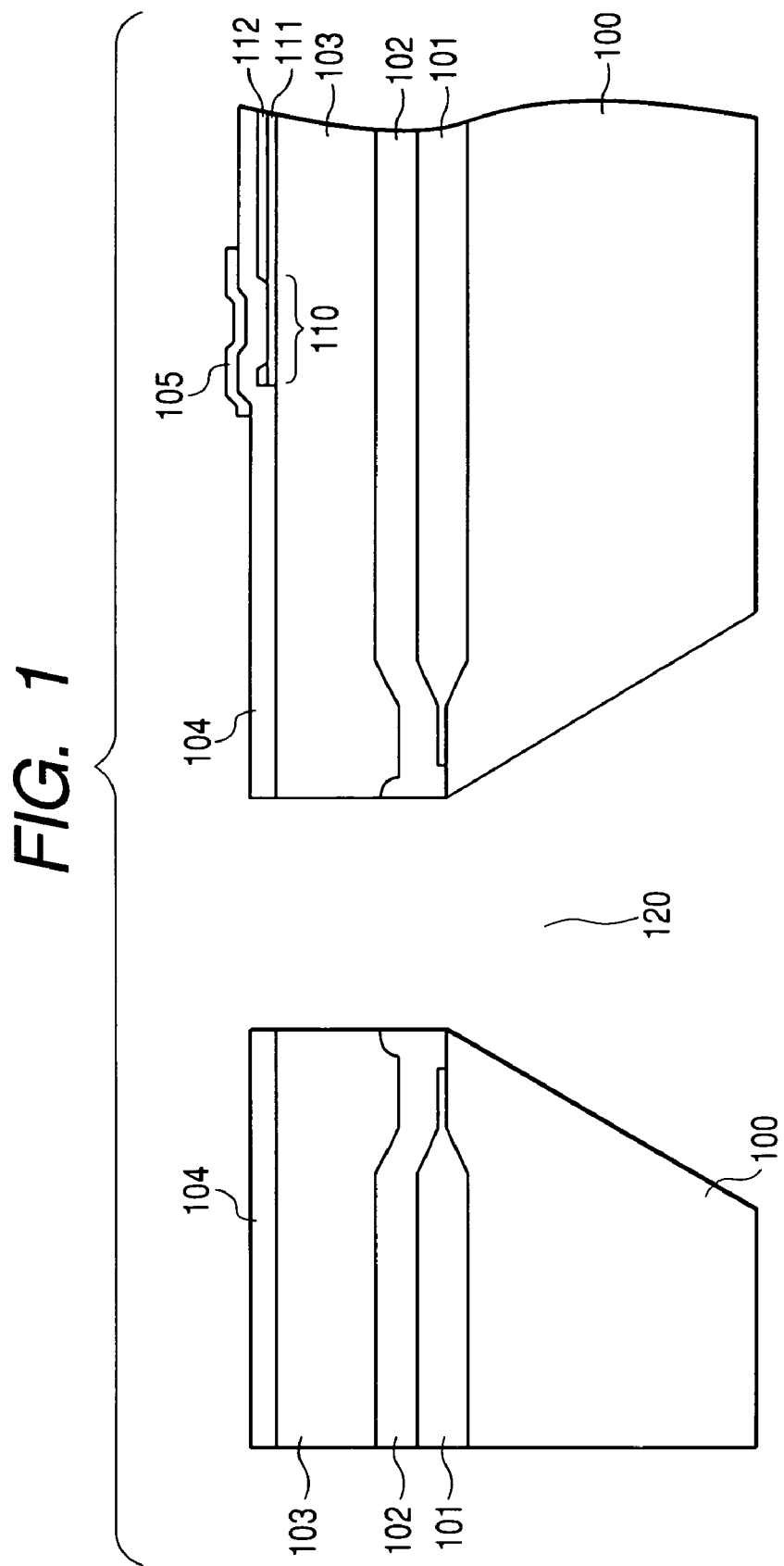

STRUCTURE WITH THROUGH HOLE, PRODUCTION METHOD THEREOF, AND LIQUID DISCHARGE HEAD

BACKGROUND OF THE INVENTION

1. Field of the Invention

The present invention relates to a structure with a through hole, comprised of a silicon (Si) semiconductor substrate and other elements, and a production method thereof and, more particularly, to a structure suitably applied to thermal recording heads, ink jet recording heads, etc., used in printers and other devices, a production method thereof, and a liquid discharge head and apparatus having the structure.

2. Related Background Art

Structures with through hole(s) are used in various fields. For example, a structure with through hole(s) comprised of a silicon semiconductor substrate and other elements is used in ink jet recording heads which are used in ink jet printers and other devices and adapted to discharge ink to implement recording. The following will describe a structure with a through hole, using an example of an ink jet recording head configured to discharge ink by thermal energy.

The ink jet recording head utilizing thermal energy is configured to impart thermal energy generated by a heating resistive element (heater), to a liquid to cause a bubbling phenomenon selectively in the liquid and discharge an ink droplet from each discharge opening by the bubbling energy. In the ink jet recording head of this type, in order to increase the recording density (resolution), a number of fine heating resistors are arranged on the silicon semiconductor substrate, discharge openings are provided for the respective heating resistors so as to face the heating resistors, and drive and peripheral circuits for driving the heating resistors are also provided on the silicon semiconductor substrate.

FIG. 8 is a sectional view showing a configuration of such an ink jet recording head.

As shown in FIG. 8, the ink jet recording head is constructed in a structure wherein a field oxide film (LOCOS oxide film) 101, a BPSG (boro-phospho silicate glass) layer 102 deposited by atmospheric CVD (chemical vapor deposition), and a silicon oxide film 103 deposited by plasma CVD are stacked on one principal surface of silicon substrate 100, heating resistors (heaters) 110 are formed on the silicon oxide film 103, and a discharge opening 140 is provided so as to face each heating resistor 110. In the drawing only one heating resistor 110 and one discharge opening 140 are depicted, but in fact, several hundred heating resistors and discharge openings are arranged in one ink jet recording head. These heating resistors are arranged at predetermined intervals (e.g., 40 µm) in the direction normal to the plane of the drawing on the single silicon substrate 100.

In order to protect the heating resistors 110 and other elements, a silicon nitride film 104 is formed as a passivation layer by plasma CVD, over the whole of the aforementioned principal surface of the silicon substrate 100 including the regions on the heating resistors 110. In portions corresponding to the heating resistors 110 along the surface of the silicon nitride film 104, tantalum (Ta) films 105 are formed as anti-cavitation layers in order to prevent deterioration of the silicon nitride film 104 due to the cavitation phenomenon caused by bubbles generated in the ink. The principal surface of the silicon substrate 100 other than the principal surface on which the heating resistors 110 are formed, is covered by a thermal oxide film 106.

The discharge openings 140 are bored in a covering resin layer 130 provided so as to cover the first aforementioned principal surface of the silicon substrate 100. A space is formed between the covering resin layer 130 and, the silicon nitride film 104 and tantalum film 105, and this space is a space filled with a liquid (ink) to be discharged from the discharge opening 140. This space will be called a liquid chamber 150.

In the ink jet recording head having the structure described above, when each heating resistor 110 is energized to generate heat, the heat generates a bubble in the discharge liquid in the liquid chamber 150 and an action force of the bubble thus generated discharges a liquid droplet from the discharge opening 140. In order to implement continuous recording, it is necessary to replenish the liquid chamber 150 with the discharge liquid (ink) by the amount of liquid contained in the liquid droplets discharged from the discharge opening 140. However, the discharge openings 140 are located in the proximity of a recording medium, such as paper or the like, and the gap is also set to be small between the discharge openings 140 and the heating resistors 110. It is thus difficult to supply the discharge liquid from the side of the silicon substrate 100 where the heating resistors 110 are formed, into the liquid chambers 150. For this reason, as illustrated, supply openings 120 are formed through the silicon substrate 100 and the discharge liquid is allowed to flow through the supply openings 120 in the direction indicated by the arrow in the drawing, whereby the discharge liquid is supplied into the liquid chambers 150. The supply openings 120 are formed by selective etching of the silicon substrate 100.

Meanwhile, the silicon substrate 100 normally has a thickness of several hundred µm. If the silicon substrate 100 were etched from the principal surface where the heating resistors 110 are formed, in order to form the supply openings 120 by etching, the etching process would take a long time even under setting of selective etching conditions and there would inevitably occur damage to each of the layers formed on the principal surface and to the heating resistors 110. The supply openings 120 are thus formed by etching of the silicon substrate 100 from the principal surface other than that on which the heating resistors 110 are formed. In that case, if an etchant flows to the side where the heating resistors 110 are formed, upon penetration of the supply openings 120, it can cause damage to the heating resistors 110 and/or each of the other layers. Therefore, layers as etching stoppers are preliminarily provided at positions intended for formation of the supply openings 120 on the principal surface of the silicon substrate 100 on which the heating resistors 110 are formed, whereby the etchant is prevented from flowing to the side where the heating resistors 110 are formed.

In the example shown in FIG. 8, the field oxide film 101, BPSG layer 102, and silicon oxide film 103 are not provided in the regions where the supply openings 120 are formed, and, instead thereof, silicon nitride films 107 formed by reduced pressure CVD are provided. The silicon nitride films 107 are patterned so as to be located only in the forming and surrounding regions of the supply openings 120, and ends thereof are formed so as to be interposed between the field oxide film 101 and the BPSG film 102. In the forming region of each supply opening 120, the silicon nitride film 107 is directly deposited on a thin oxide film 108 on the surface of the silicon substrate 100. The silicon nitride film 104 deposited by plasma CVD is also formed on the silicon nitride films 107 by reduced pressure CVD.

During the final stage of etching, the silicon nitride film 107 is exposed in the bottom of each supply opening 120 formed, as described later. If in this stage the silicon nitride film 107 and the silicon nitride film 104 crack or peel off from the silicon substrate 100, the etchant will leak to the side of the heating resistors 110, which is not preferred. For this reason, as also described in Japanese Patent Application Laid-Open No. 10-181032 (counterpart of U.S. Pat. No. 6,143,190), the silicon nitride film 107 is formed by reduced pressure CVD, so that the internal stress of the silicon nitride film 107 becomes a tensile stress, which can prevent the occurrence of peeling or the like.

Now, the structure of the heating resistor 110 will be described. FIG. 9A is a schematic perspective view illustrating the structure of the heating resistor (heater), and FIG. 9B is a circuit diagram showing the part including the heating resistor and a switching device for driving it.

The heating resistor 110 is made in such a manner that a resistive layer 111 made of an electrically resistive material, such as tantalum silicon nitride (TaSiN) or the like, and an aluminum (Al) layer 112 as an electrode layer are formed in the same pattern, and a part of the aluminum layer 112 is removed so that only the resistive layer 111 remains in that part of the heating resistor 110. The part where only the resistive layer 111 exists serves as a heat generating portion upon supply of electricity (heating surface H). In the example illustrated, the resistive layer 111 and aluminum layer 112 are deposited in the order named on the silicon oxide layer 103; thereafter, unnecessary portions of the two layers are first removed by etching so as to leave a U-shaped pattern, and then only the aluminum layer 112 is further removed in the part becoming the heating portion H, thereby completing the heating resistor 110. Thereafter, the entire heating resistor 110 is covered by the silicon nitride film 104 as a passivation layer.

A method of producing the ink jet recording head as described above will be described next. In order to simplify the description, the following discussion will exclude description of the thermal oxide film 106 formed on the side of the silicon substrate 100 other than the side on which the heating resistors 110 are formed, and FIGS. 10A to 10D and 11A to 11C show only the structure of a supply opening 120 (the forming position thereof) and its surroundings.

The production method of the ink jet recording head using the silicon substrate with through holes is described, for example, in Japanese Patent Application Laid-Open No. 10-181032. First, as shown in FIG. 10A, the field oxide film 101 is selectively formed, for example, in a thickness of about 700 nm, on one principal surface of the silicon substrate 100. A thin oxide film 108 is formed in the region where no field oxide film 101 is formed. Next, as shown in FIG. 10B, the oxide film 108 is removed at a portion corresponding to the forming position of the supply opening 120 to expose the silicon surface and, as shown in FIG. 10C, a polysilicon layer 121 to become a sacrificial layer is further selectively formed at the exposed position of the silicon surface, for example, in a thickness of 200 to 500 nm. At this time, the silicon surface without the oxide film 108 completely surrounds the polysilicon layer 121. Thereafter, as shown in FIG. 10D, the silicon nitride film 107 is selectively formed at and around the forming position of the supply opening 120 by reduced pressure CVD. The thickness of the silicon nitride film 107 is, for example, approximately 200 to 300 nm.

Next, as shown in FIG. 11A, the BPSG layer 102 is formed, for example, in a thickness of 700 nm over the entire surface of the silicon nitride film 107 and the field oxide film 101 by atmospheric CVD, and the silicon oxide film 103 is then formed, for example, in a thickness of 1.4 μm over the entire surface of the BPSG layer 102 by plasma CVD. The surface of the silicon oxide film 103 is almost flat. Then, as shown in FIG. 11B, the silicon oxide film 103 and the BPSG layer 102 are selectively removed in a region that corresponds to the position where the supply opening 120 is to be formed but that is a little larger than the to-be-formed supply opening 120. At this time, the ends of the removed part are located at positions where they are placed on the silicon nitride film 107, and the field oxide film 101 also exists below it.

Subsequently, the resistive layer 111 and aluminum layer 112 are formed, these are then patterned in the U-shaped pattern as described above, and the aluminum layer 112 is further selectively removed from the position to become the heating portion, thereby forming the heating resistor 110 on the silicon oxide film 103. Thereafter, as shown in FIG. 11C, the silicon nitride film 104 to become a passivation layer is formed, for example, in a thickness of 800 nm over the entire surface, the tantalum film 105 as an anti-cavitation layer is selectively formed, and the silicon substrate 100 at the supply opening forming position and the polysilicon layer 121 as a sacrificial layer are removed by anisotropic etching from the side where no heating resistor 110 is formed on the silicon substrate 100 (the lower side in the drawing), thereby forming the supply opening 120. At this time, the silicon nitride film 107 lined with the silicon nitride film 104 is exposed as a so-called membrane in the bottom part of the supply opening 120. In the final stage of the etching, only this membrane serves to prevent the etchant from entering the heating resistor 110 side, so that keeping the membrane from cracking or peeling off contributes to great improvement in the yield of recording heads.

Finally, the silicon nitride film 107 and the silicon nitride film 104 are removed from the region located at the bottom surface of the supply opening 120 by dry etching using a fluorine base or oxygen base gas. This completes the substrate for the recording head having the supply opening 120 for supply of ink or the like as a through hole. Thereafter, the covering resin layer 130 and the discharge opening 140 are formed by known methods.

Among the above steps, the patterning steps necessary for formation of the supply opening 120 (only those necessitating photomasks) include the step of removing part of the oxide film 108 as shown in FIG. 10B, the step of selectively providing the polysilicon layer 121 as shown in FIG. 10C, the step of selectively providing the silicon nitride film 107 as shown in FIG. 10D, the step of removing the BPSG layer 102 and the silicon oxide layer 103 by etching corresponding to the position of the supply opening 120 as shown in FIG. 11B, and the step of forming the supply opening 120 by etching of the silicon substrate 100 as shown in FIG. 11C.

On the other hand, the heating resistor 110 is connected at one end, for example, to a power supply $V_H$ of about +30 V and at the other end to a drain D of a MOS field effect transistor M1 as a switching device for driving, as shown in FIG. 9B. A source S of the transistor M1 is grounded and drive pulses are applied to a gate G of the transistor to drive the resistor. In the case where the drive circuit, including the transistor M1, and other peripheral circuits are formed on the silicon substrate 100, the BPSG layer 102 and the silicon oxide film 103 are formed so as to serve as interlayer dielectrics and the silicon nitride film 104 is formed so as to serve as a passivation layer. The field oxide film 101 is used for device isolation in the regions where the drive and peripheral circuits are formed.

In the conventional structure, the reason why the silicon nitride film 107 deposited by reduced pressure CVD is intentionally used as the membrane serving as an etching stopper during the formation of the supply opening 120 by etching, is that the internal stress of this film is a tensile stress. In contrast, the internal stress of the silicon oxide film 103 deposited by plasma CVD is a compressive stress. It has been believed heretofore that it was necessary to maintain the tension of the membrane through use of a film with a tensile stress as the membrane in order to avoid cracking or peeling off of the membrane during etching. For this reason, the silicon nitride film 107 deposited by reduced pressure CVD has been used. Namely, it has been believed that the problem of cracking or peeling was unavoidable in the case of a film with a compressive stress.

In the case of the conventional production method of ink jet recording head described above, even if the method is arranged to simultaneously perform the step of providing the supply opening as a through hole in the silicon substrate and the step of forming the heating resistor, drive circuit, and peripheral circuits on the silicon substrate, the method requires at least five photomasks associated with only the step of providing the supply opening, and the total number of photomasks used is 17 or 18, including processing of other portions not here described. The steps are thus complex. Particularly, the silicon nitride film with the tensile stress (the silicon nitride film deposited by reduced pressure CVD in the above example) needs to be provided as a membrane by patterning and the silicon oxide film has to be patterned near the forming position of the through hole, which poses a problem that the number of manufacturing steps is large.

Since the conventional silicon nitride layer serving as a passivation layer and as a membrane has a typical thickness of about 800 nm, the membrane region has a large compressive stress and the silicon nitride film having a tensile stress is needed for relaxation thereof. On the other hand, in the case of silicon nitride of this thickness, the heat generated by the heating resistor is transferred through this silicon nitride film to the discharge liquid, so that the utilization efficiency of the heat is not satisfactory, thus posing a problem that the frequency is limited in the case of executing repetitive discharges.

SUMMARY OF THE INVENTION

An object of the present invention is, therefore, to provide a structure and a production method thereof with a reduced number of steps, at low cost, and with high reliability.

Another object of the present invention is to provide a structure with an excellent through hole and a production method thereof.

Still another object of the present invention is to provide a liquid discharge head and a liquid discharge apparatus using such a structure.

The present invention accomplishes at least one of these.

In the present invention, a silicon nitride film is provided on an upper surface of a silicon oxide film and the stack structure of the silicon oxide film and the silicon nitride film is also used in that state as a membrane against etching for formation of a through hole, even at the forming position of the through hole. The silicon oxide film is used, for example, as an interlayer dielectric or the like and normally has an almost flat upper surface. Therefore, the silicon nitride film formed thereon is also resistant to formation of a step, whereby the membrane is prevented from cracking or the like during the formation of the through hole by etching. The silicon oxide film stated herein can be chosen from among $SiO_x$ films formed by plasma CVD, silicon oxides containing impurities, such as PSG, BSG, and BPSG films, and so on.

Specifically, a structure according to the present invention comprises a semiconductor substrate, a silicon oxide film and a silicon nitride film provided on a first principal surface of the semiconductor substrate, and a through hole penetrating the semiconductor substrate, the silicon oxide film, and the silicon nitride film, wherein the silicon nitride film is formed in contact with an upper surface of the silicon oxide film, at least at a side portion of the through hole.

A production method of a structure according to the present invention is a method of producing a structure comprising a semiconductor substrate, a silicon oxide film and a silicon nitride film provided on a first principal surface of the semiconductor substrate, and a through hole penetrating the semiconductor substrate, the silicon oxide film, and the silicon nitride film, the method comprising: forming a sacrificial layer on the first principal surface of the semiconductor substrate at a position corresponding to a forming position of the through hole; forming the silicon oxide film so as to cover the whole of the sacrificial layer and the first principal surface; forming the silicon nitride film on an upper surface of the silicon oxide film; thereafter, etching the semiconductor substrate from a second principal surface side of the semiconductor substrate to remove the sacrificial layer; and etching the silicon oxide film and the silicon nitride film to form the through hole.

The present invention as described above obviates the need for provision of a silicon nitride film formed so as to have a tensile stress by reduced pressure CVD only for the purpose of serving as a membrane.

In the present invention, it is preferable that the semiconductor substrate be a silicon substrate, and it is preferable that a circuit element be provided on the first principal surface of the silicon substrate. The circuit element herein is, for example, a MOS field effect transistor formed on the first principal surface by an ordinary semiconductor production process. In the case where the circuit element is provided, the sacrificial layer can be made of the same material as the gate electrode or the source-drain electrodes of the circuit element and simultaneously in the step of forming the gate electrode or the source-drain electrodes.

The structure described above is also suitably applicable as a substrate for a recording head. Such a substrate for a recording head is a recording head substrate comprising a semiconductor substrate, a silicon oxide film and a silicon nitride film provided on a first principal surface of the semiconductor substrate, a heating resistor interposed between the silicon oxide film and the silicon nitride film, and a supply opening penetrating the semiconductor substrate, the silicon oxide film, and the silicon nitride film and adapted to supply a liquid, wherein the silicon nitride film is formed in contact with an upper surface of the silicon oxide film, at least at a side portion of the supply opening. In this case, it is particularly preferable that the semiconductor substrate be a silicon substrate and that a circuit element for driving the heating resistor be provided on the first principal surface.

A liquid discharge apparatus according to an embodiment of the present invention comprises a liquid discharge head, and a container for accommodating the liquid supplied through the supply opening.

BRIEF DESCRIPTION OF THE DRAWINGS

FIG. 1 is a schematic sectional view showing a structure as an embodiment of the present invention, which is used as a substrate for an ink jet recording head;

DETAILED DESCRIPTION OF THE PREFERRED EMBODIMENTS

Figure 2A:
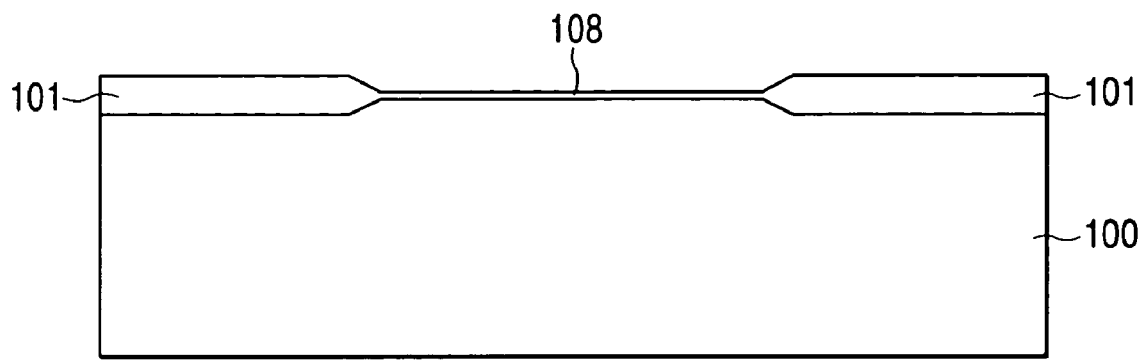
FIGS. 2A, 2B and 2C are schematic sectional views showing production steps of the structure shown in FIG. 1.

The preferred embodiments of the present invention will be described below with reference to the drawings.

FIG. 1 is a schematic sectional view showing a structure as a preferred embodiment of the present invention. In FIG. 1, the elements denoted by the same reference symbols as those in FIGS. 8, 10A to 10D, and 11A to 11C have functions similar to those in FIGS. 8, 10A to 10D, and 11A to 11C.

The structure shown in FIG. 1 is configured as a substrate for an ink jet recording head as a liquid discharge head or a liquid discharge apparatus and is different from the aforementioned structure shown in FIGS. 8, 10A to 10D, and 11A to 11C in that the silicon nitride film 104 is formed in contact with the upper surface of the silicon oxide film 103 at the side portion of the through hole. Specifically, it is different in detail in that, without provision of the silicon nitride film formed by reduced pressure CVD, the membrane used during the formation of the supply opening is constructed of the BPSG layer 102 deposited by atmospheric CVD, the silicon oxide film 103 deposited by plasma CVD, and the silicon nitride film 104 deposited by plasma CVD which also functions as a passivation layer. The internal stress of the silicon nitride film 104 is preferably a compressive stress of not more than $3 \times 10^8$ Pa. In the structure shown in FIGS. 8, 10A to 10D, and 11A to 11C, the BPSG layer 102 and the silicon oxide film 103 were removed in the size greater than the diameter of the supply opening 120, whereas in the structure shown in FIG. 1, the BPSG layer 102, silicon oxide film 103, and silicon nitride film 104 are removed in the size approximately equal to that of the supply opening 120. At the edge part of the supply opening 120, the BPSG layer 102 is in direct contact with the silicon substrate 100, without intervention of the oxide film. Although not illustrated herein, drive and peripheral circuits for driving each heating resistor are monolithically integrated on the silicon substrate 100 as occasion demands. The following will describe as an example the structure with the drive and peripheral circuits integrated.

A production method of this structure will be described below with reference to FIGS. 2A to 2C, 3A and 3B. FIGS. 2A to 2C, 3A and 3B show only the vicinity of the position where a supply opening 120 is to be formed, and are drawn without illustration of the forming region of the heating resistor.

Figure 2B:
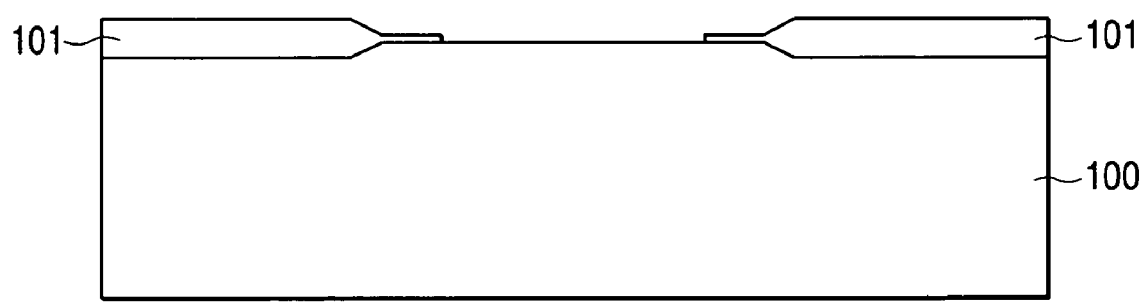
Figure 2C:
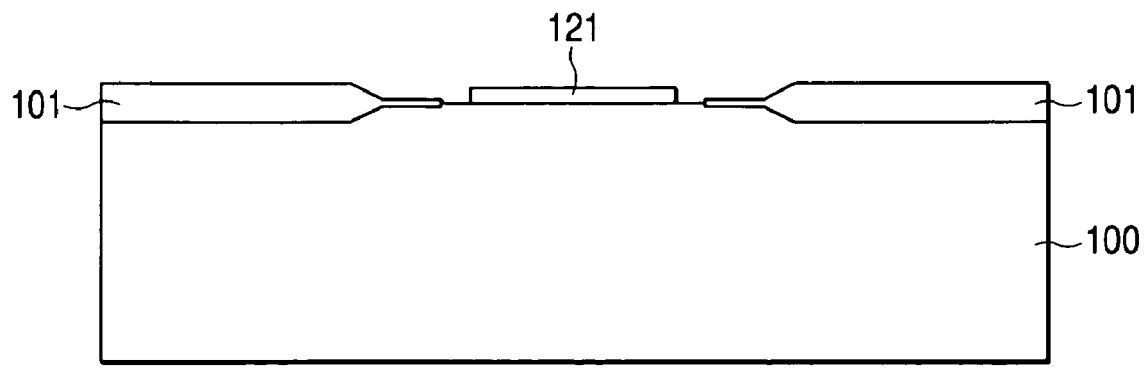

First, as shown in FIG. 2A, the field oxide film 101 is selectively formed, for example, in a thickness of about 700 nm on one principal surface of the silicon substrate 100, for example, by thermal oxidation. The thin oxide film 108 is formed in the region without the field oxide film 101. Next, as shown in FIG. 2B, the oxide film 108 is removed at a position corresponding to the forming position of the supply opening 120 to expose the silicon surface there and, as shown in FIG. 2C, the polysilicon layer 121 as a sacrificial layer is further selectively formed, for example, in a thickness of 200 to 500 nm, at the exposed position of the silicon surface, for example, by reduced pressure CVD and reactive ion etching. At this time, a portion of the silicon surface without the oxide film 108 completely surrounds the polysilicon layer 121. Before completion of the stage shown in FIG. 2C, the steps of forming a gate insulating film and gate electrodes are finished in the forming region of the drive and peripheral circuits. Here the polysilicon layer 121 is preferably formed in the same steps as the film forming step and etching step of the gate electrodes of the MOS transistors constituting the drive and peripheral circuits, because there is no need for provision of a mask dedicated for the sacrificial layer.

The process is also arranged to complete a step of implantation of impurity ions into the source/drain regions thereafter.

Figure 3A:
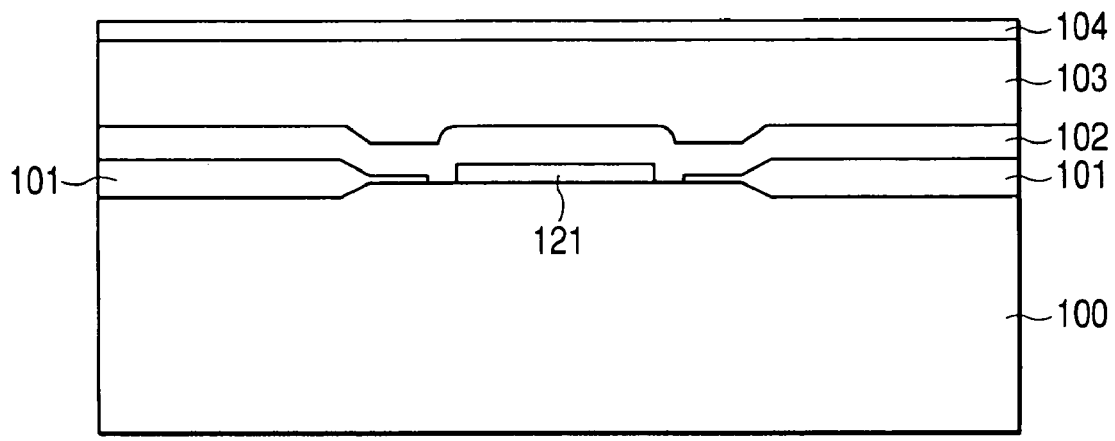
FIGS. 3A and 3B are schematic sectional views showing production steps of the structure shown in FIG. 1.

Then as shown in FIG. 3A, the BPSG layer 102 is formed, for example, in a thickness of 700 nm over the entire surface by atmospheric CVD, and, in the drive and peripheral circuits, contact holes are formed by etching, a conductor layer of aluminum or the like is formed for the source and drain electrodes, and a wiring pattern is formed by dry etching with a chlorine base gas.

Then the silicon oxide film 103 is formed, for example, in a thickness of 1.4 μm over the entire surface on the BPSG layer 102 by plasma CVD. In the drive and peripheral circuits, the silicon oxide film 103 serves as an interlayer dielectric covering the conductor layer, and through holes are formed therein by reactive ion etching.

Although not shown herein, the heating resistors are also formed in much the same manner as in the case of the conventional technology, and are connected through the through holes to the drive circuit.

Figure 3B:
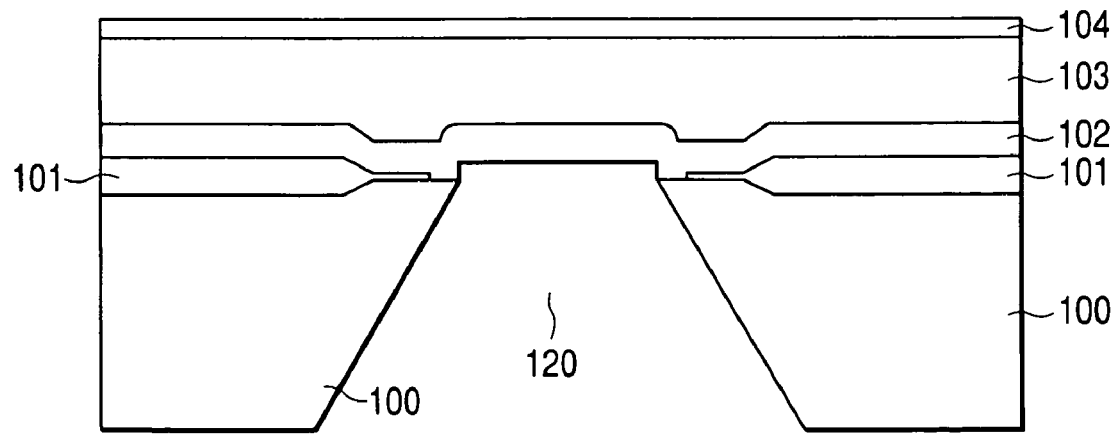

Thereafter, as shown FIG. 3A, the silicon nitride film 104 to become a passivation layer is formed, for example, in a thickness of 300 nm over the entire surface on the silicon oxide film 103, the heating resistors, and so on. Since in the vicinity of the forming position of the supply opening 120 the BPSG layer 102 and the silicon oxide film 103 are left without being etched, below the silicon nitride film 104, the silicon nitride film 104 is formed as an extremely flat film. After that, a tantalum film (not shown) as an anti-cavitation layer is selectively formed. Then, as shown in FIG. 3B, an anti-etching mask (not shown) is formed on the back surface of the substrate, and the silicon substrate 100 at the forming position of each supply opening and the polysilicon layer 121 as a sacrificial layer are removed from the lower side of the silicon substrate 100 in the drawing by anisotropic etching using an etchant such as TMAH (tetramethylammoniumhydroxide) or the like, thereby forming the supply openings 120. At this time, the membrane of the stack consisting of the BPSG layer 102, silicon oxide film 103, and silicon nitride film 104 is exposed in the bottom part of each supply opening 120.

Finally, the BPSG layer 102, silicon oxide film 103, and silicon nitride film 104 located on the bottom surface of the supply opening 120 are removed from the back surface of the substrate by dry etching using a fluorine base or oxygen base gas. This results in completing the recording head substrate having the supply openings 120 for supply of ink or the like as through holes. The etching step herein may be wet etching for removing the silicon oxide film 103. Thereafter, the covering resin layer 130 and the discharge openings 140 are formed by known methods, thereby completing the ink jet recording head having the above-stated structure as a substrate for a recording head.

Various insulating layers necessary for the circuit elements such as transistors in the drive and peripheral circuits are formed in conjunction with the forming steps of the field oxide film 101, BPSG layer 102, and silicon oxide film 103, as described above.

In the case where the structure described above is formed as a substrate for the ink jet recording head, the patterning steps associated with only the formation of the supply openings 120 (only the steps necessitating photomasks) include the step of removing part of the oxide film 108 as shown in FIG. 2B, the step of selectively providing the polysilicon layer 121 as shown in FIG. 2C, and the step of forming the supply openings 120 by etching of the silicon substrate 100 as shown in FIG. 3B. The number of steps is two less than the number of steps in the conventional method shown in FIGS. 10A to 10D and 11A to 11C. Furthermore, if the forming step of the polysilicon layer 121 as a sacrificial layer is carried out simultaneously in the step of forming the gate electrodes of the MOS transistors, the number of steps is further reduced by one. Accordingly, the method of the present embodiment can reduce the total number of necessary photomasks by two or three, compared with the conventional methods. Since the structure of the present embodiment permits the silicon nitride film to be formed in a smaller thickness than the silicon nitride films used heretofore, it is feasible to further increase the thermal efficiency as compared with the conventional structures and, at the same time, decrease the compressive stress of the film stack constituting the membrane region, which obviates the need for the step of forming the silicon nitride film so as to have a tensile stress.

Figure 4:
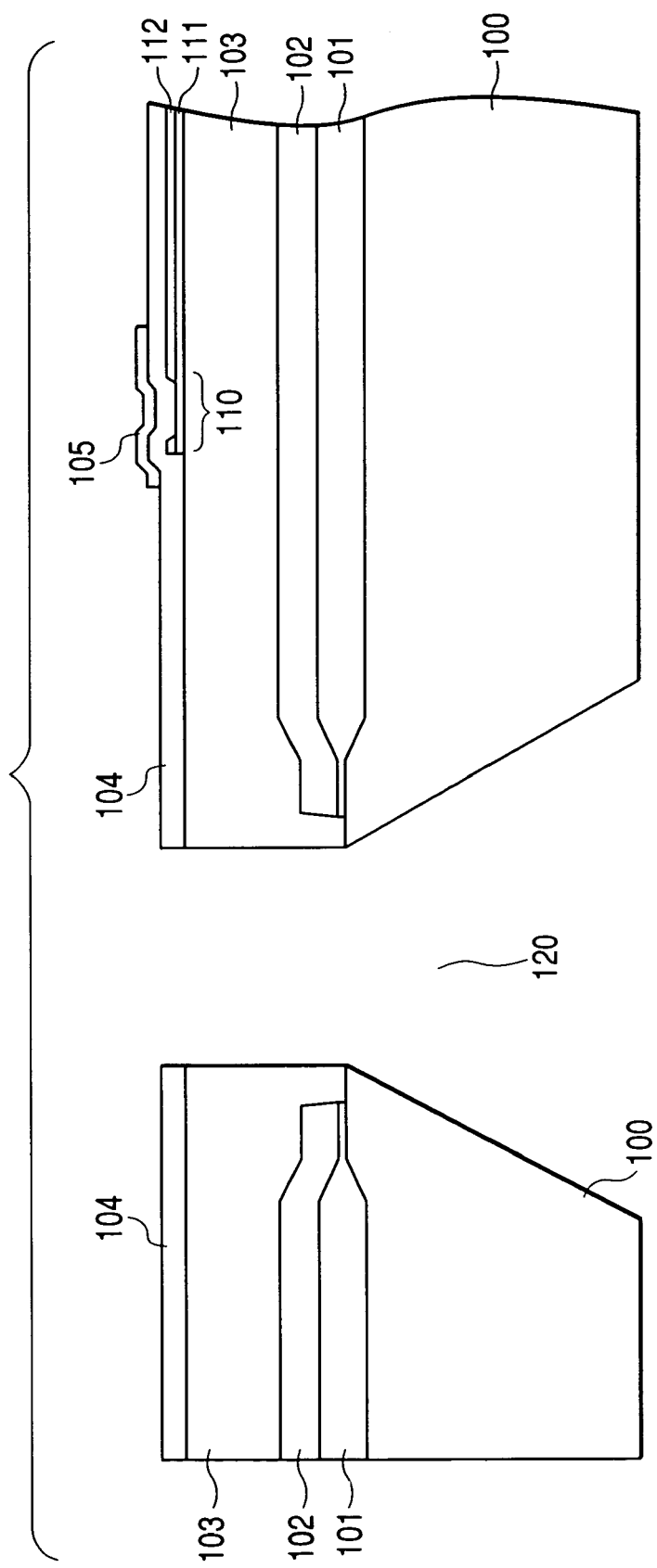
FIG. 4 is a schematic sectional view showing a structure as another embodiment of the present invention, which is used as a substrate for an ink jet recording head.

FIG. 4 is a schematic sectional view showing a structure as another embodiment of the present invention. The structure shown in FIG. 4 is constructed as a substrate for an ink jet recording head and is similar to the aforementioned structure shown in FIG. 1, but is different therefrom in that at the edge part of the supply opening 120, the BPSG layer 102 is not in direct contact with the silicon substrate and, instead thereof, the silicon oxide film 103 is in direct contact with the silicon substrate 100, without intervention of an oxide film.

A production method of this structure will be described below with reference to FIGS. 5A to 5C, 6A and 6B. FIGS. 5A to 5C, 6A and 6B show only the vicinity of the position where a supply opening 120 is to be formed, and are drawn without the illustration of the forming region of the heating resistor.

Figure 5A:
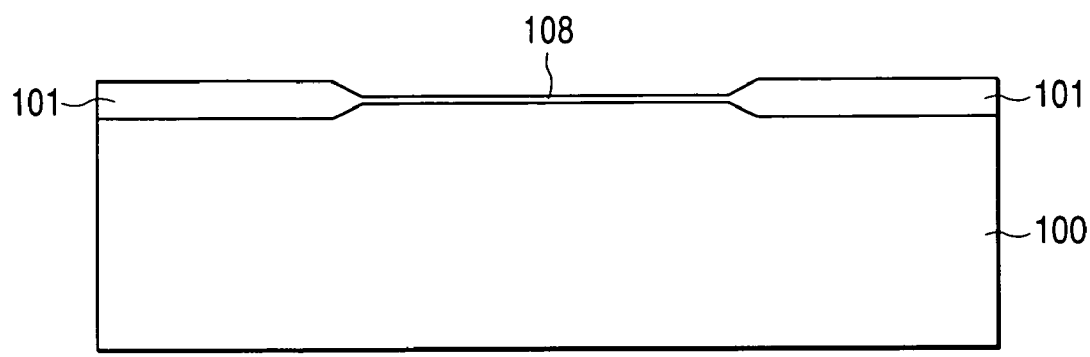
FIGS. 5A, 5B and 5C are schematic sectional views showing production steps of the structure shown in FIG. 4.
Figure 5B:
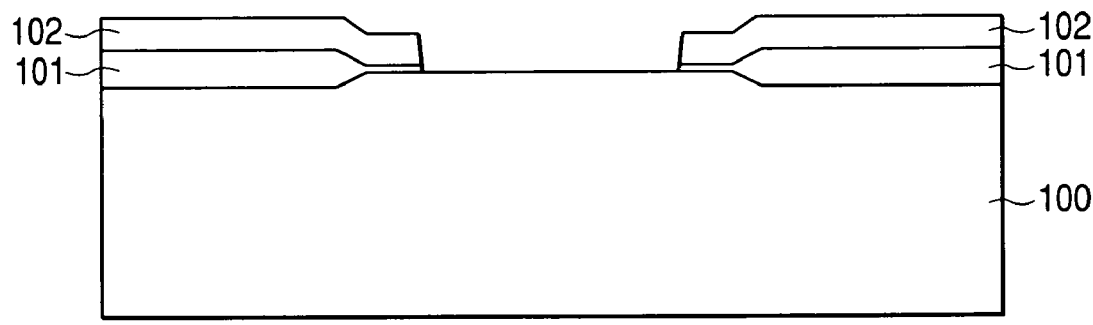
Figure 5C:
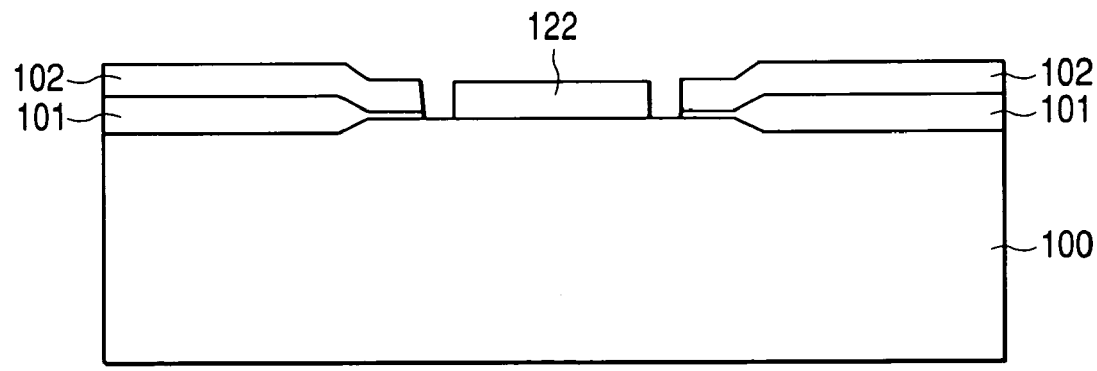

First, as shown in FIG. 5A, the field oxide film 101 is selectively formed, for example, in a thickness of about 700 nm on one principal surface of the silicon substrate 100. The thin oxide film 108 is formed in the region where no field oxide film 101 is formed. This oxide film 108 is preferably arranged to function as a gate oxide film in the drive and peripheral circuits, because the number of steps can be reduced thereby. Thereafter, the gate electrodes are formed in the region of the drive and peripheral circuits, and impurity ions are injected into the source/drain regions. Thereafter, as shown in FIG. 5B, the BPSG layer 102 is formed, for example, in a thickness of 700 nm over the entire surface by atmospheric CVD, and then the BPSG layer 102 and oxide film 108 are removed by etching to expose the silicon surface, in positions corresponding to the positions where the supply openings 120 are to be formed, simultaneously in the step of forming the contact holes in the drive and peripheral circuits. This step requires no mask dedicated only for exposing the silicon surface in the supply opening portions. Furthermore, as shown in FIG. 5C, a film of aluminum (Al) containing copper (Cu) or silicon (Si) is selectively deposited and etched at the exposed positions of the silicon surface to form a sacrificial layer 122 of aluminum, for example, in a thickness of 400 to 800 nm, simultaneously in the step of forming the source and drain electrodes in the drive and peripheral circuits. When this layer of aluminum containing copper or silicon is used as an electrode contact layer in the drive and peripheral circuits, there is no need for provision of a mask dedicated only for the formation of the sacrificial layer in the supply opening portions. At this time, the silicon surface without the oxide film 108 completely surrounds the sacrificial layer 122. It is preferable to use a metal such as aluminum or the like as the sacrificial layer, as in the present embodiment, rather than using poly-Si as the sacrificial layer. The reason for this is as follows. A metal such as aluminum or the like can also be used readily as a layer of the peripheral circuits, whereas in the case of poly-Si, it would be necessary to employ a configuration doped with impurities, depending upon the conditions, in order to also use it for the peripheral circuits. When such poly-Si is used as the sacrificial layer, etching rates can decrease.

Figure 6A:
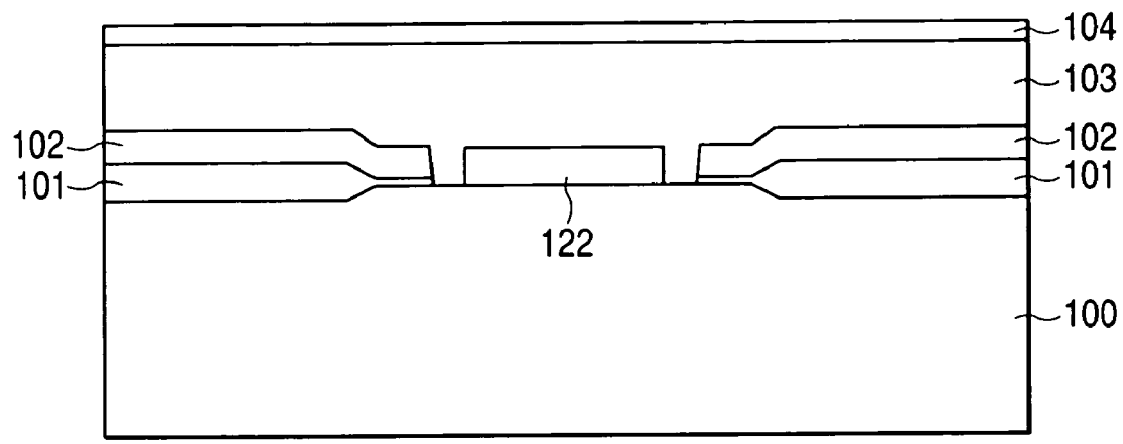
FIGS. 6A and 6B are schematic sectional views showing production steps of the structure shown in FIG. 4.

Then, as shown in FIG. 6A, the silicon oxide film 103 is formed, for example, in a thickness of 1.4 μm over the entire surface by plasma CVD. Thereafter, though not shown herein, the heating resistors are formed together with wiring plugs and wiring layers for wiring, in much the same manner as in the case of the conventional technology. Furthermore, as shown in FIG. 6A, the silicon nitride film 104 to become a passivation film is formed, for example, in a thickness of 300 nm over the entire surface by plasma CVD, and the tantalum film (not shown) as an anti-cavitation layer is further selectively formed.

Figure 6B:
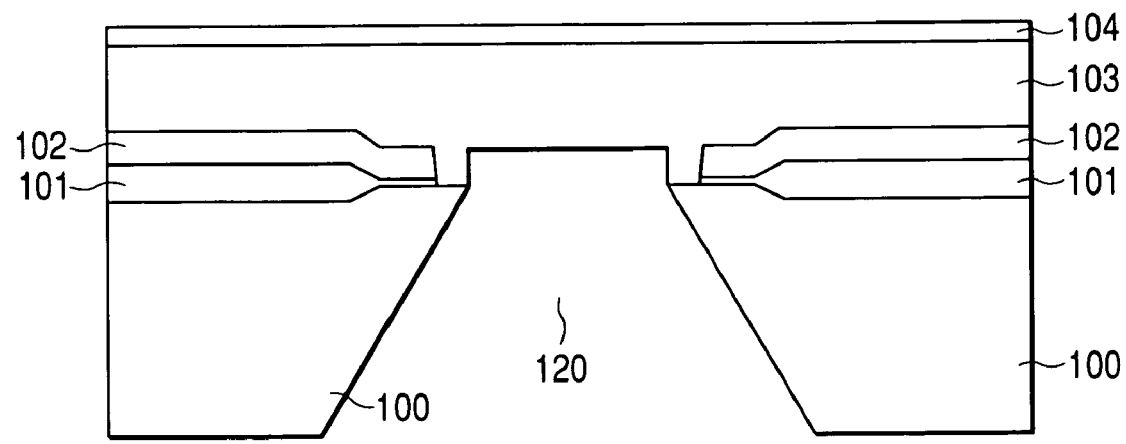

Then, as shown in FIG. 6B, the silicon substrate 100 at each supply opening forming position and the sacrificial layer 122 are removed by anisotropic etching from the lower side of the silicon substrate 100 in the drawing, to form the supply openings 120. At this time, the membrane consisting of silicon oxide film 103 and silicon nitride film 104 is exposed in the bottom part of each supply opening 120.

Finally, the silicon oxide film 103 and silicon nitride film 104 are removed from the bottom surface of each supply opening 120 by dry etching using a fluorine base or oxygen base gas. The etching step herein may be wet etching for removing the silicon oxide film 103. This results in completing the substrate for the recording head having the supply openings 120 for supply of ink or the like as through holes. Thereafter, the covering resin layer 130 and discharge openings 140 are formed by known methods, thereby completing the ink jet recording head using the structure as a substrate for the recording head.

In the case where the structure described above is formed as a substrate for an ink jet recording head, since some patterning steps necessary for the formation of the supply openings are carried out in the same steps as the contact hole forming step, the electrode forming step, and the through hole forming step necessary for the formation of the drive and peripheral circuits, the patterning step associated with the formation of the supply openings 120 (the only step necessitating a photomask) includes only the step of forming the supply openings 120 by etching of the silicon substrate 100. This amounts to four fewer steps than in the conventional method shown in FIGS. 10A to 10D and 11A to 11C. Accordingly, the method of the present embodiment can decrease the total number of necessary photomasks by four, compared to the conventional method. Since the structure of the present embodiment permits the silicon nitride film to be formed in a smaller thickness than in the conventional structures, it is feasible to further increase the thermal efficiency, as compared with the conventional structures, and, at the same time, decrease the compressive stress of the film stack constituting the membrane region, which can obviate the necessity of the step of forming the silicon nitride film so as to have a tensile stress. In addition, the configuration of the present embodiment is preferable in that the durability against ink is further enhanced, because the BPSG film is not exposed at the edge part of the supply openings.

In each of the above embodiments, when the heating resistors are monolithically integrated together with the devices such as the transistors forming the drive and peripheral circuits, some steps can be performed in common with steps for the formation of the supply openings, which can greatly simplify the production process.

Figure 7:
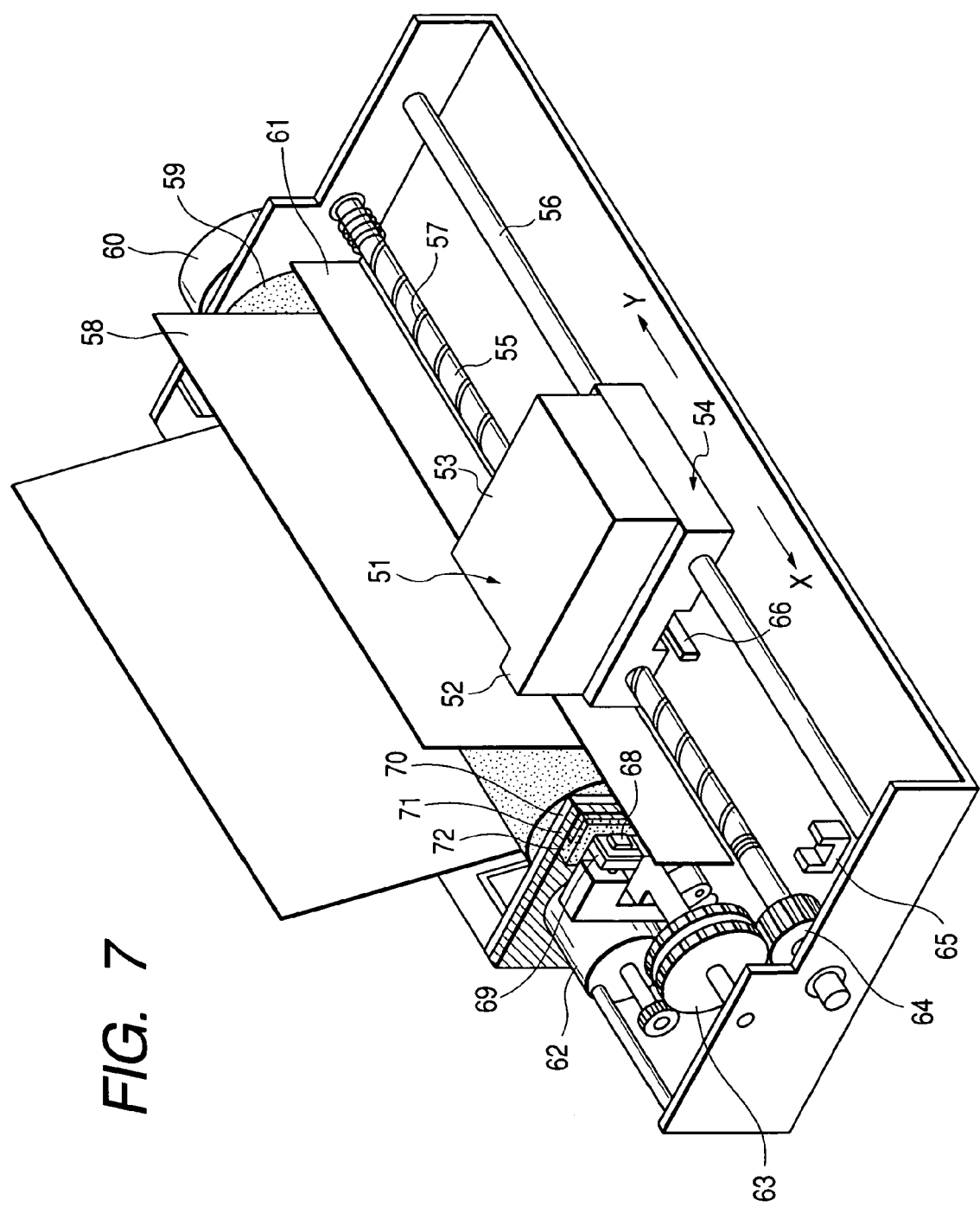
FIG. 7 is a perspective view showing an ink jet recording apparatus.
Figure 8:
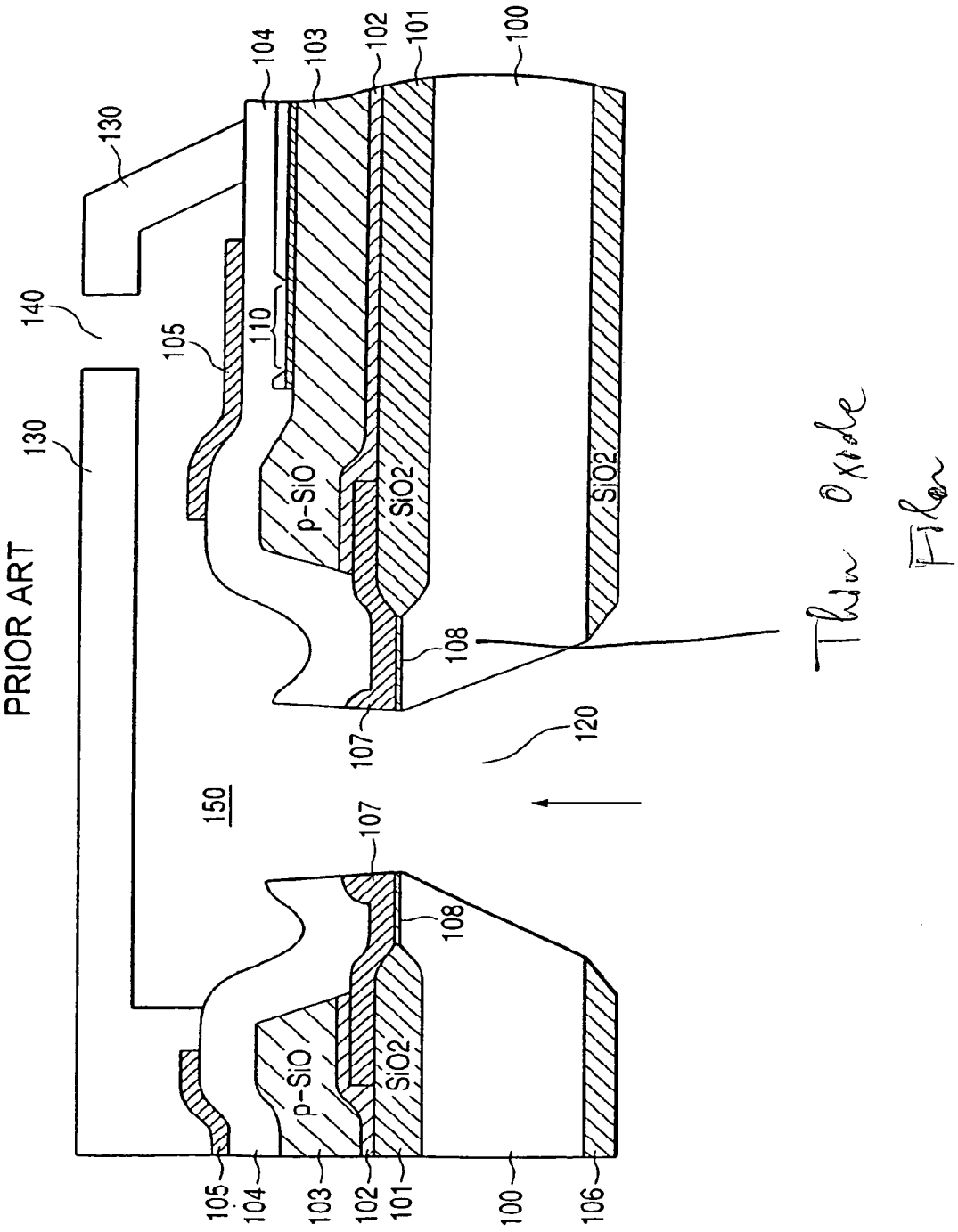
FIG. 8 is a schematic sectional view showing a configuration of a conventional ink jet recording head.
Figure 9A:
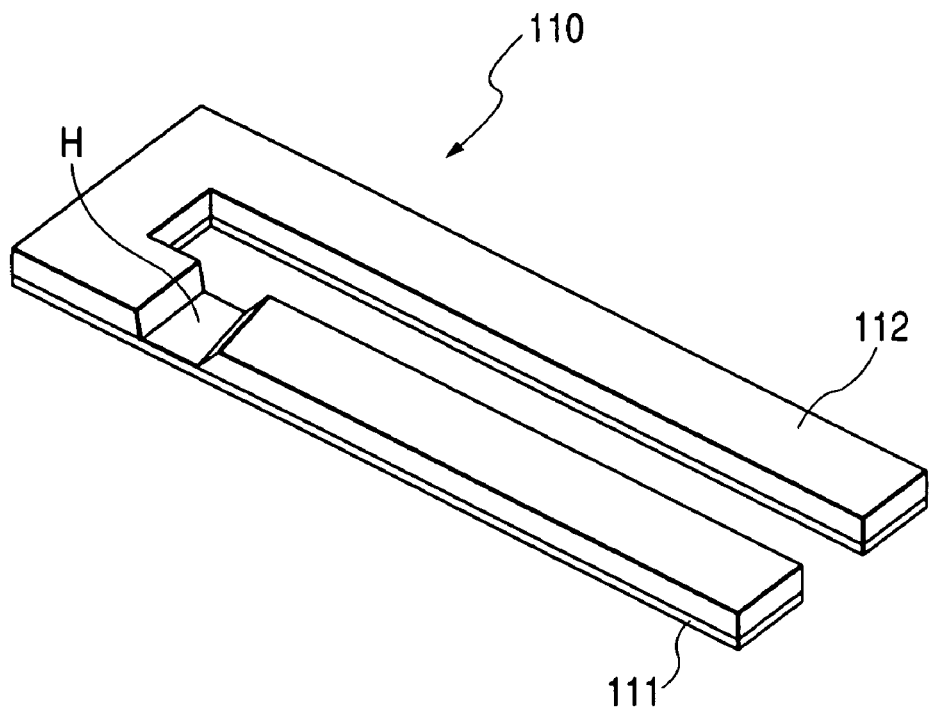
FIG. 9A is a perspective view showing a heating resistor, and FIG. 9B a circuit diagram showing a circuit including a heating resistor and a switching device (MOS field effect transistor) for driving it.
Figure 9B:
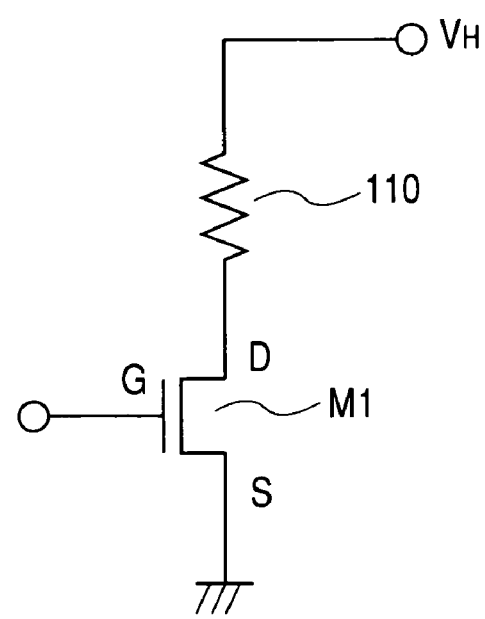
Figure 10A:
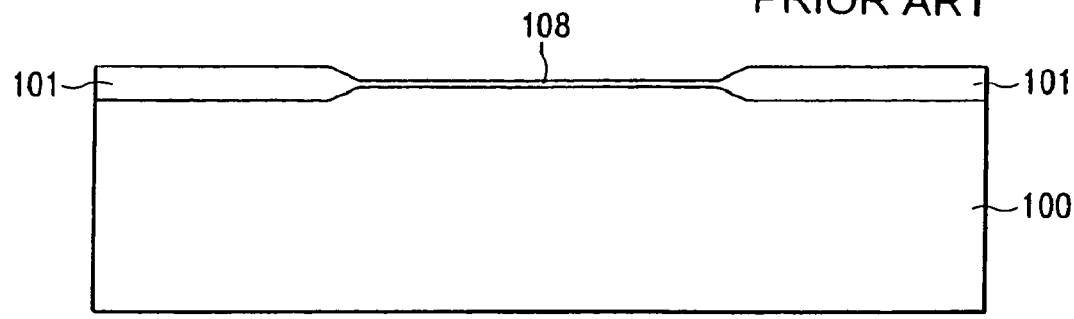
FIGS. 10A, 10B, 10C and 10D are sectional views showing production steps of the ink jet recording head shown in FIG. 8.
Figure 10B:
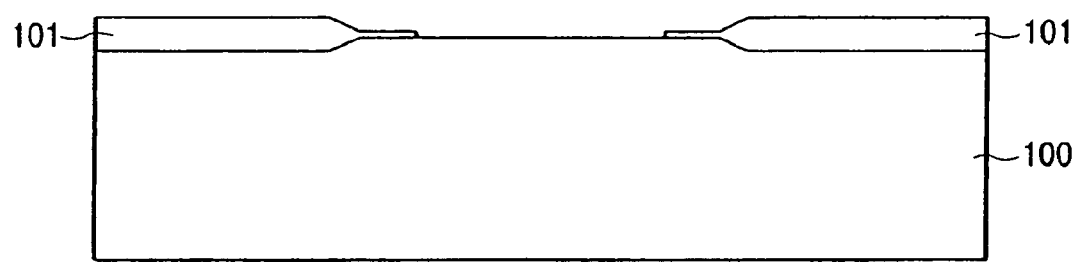
Figure 10C:
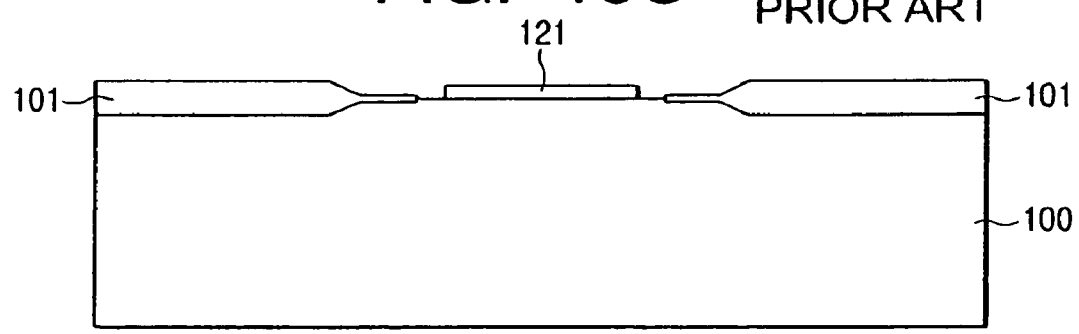
Figure 10D:
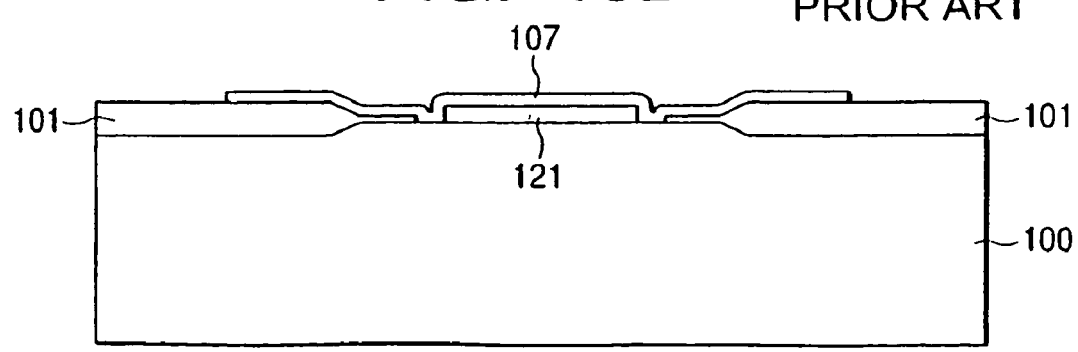
Figure 11A:
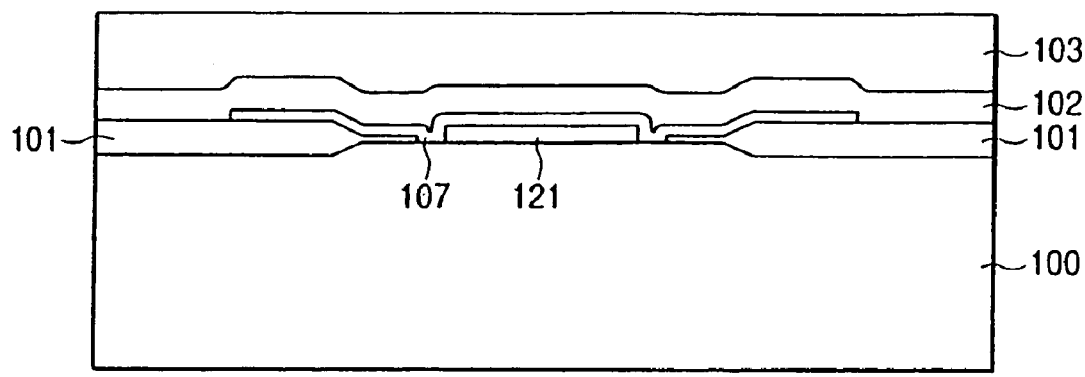
FIGS. 11A, 11B and 11C are sectional views showing production steps of the ink jet recording head shown in FIG. 8.
Figure 11B:
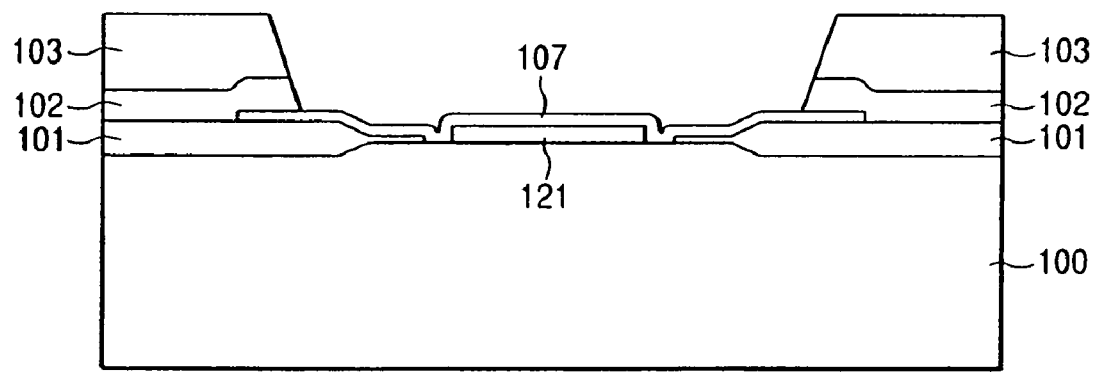
Figure 11C:
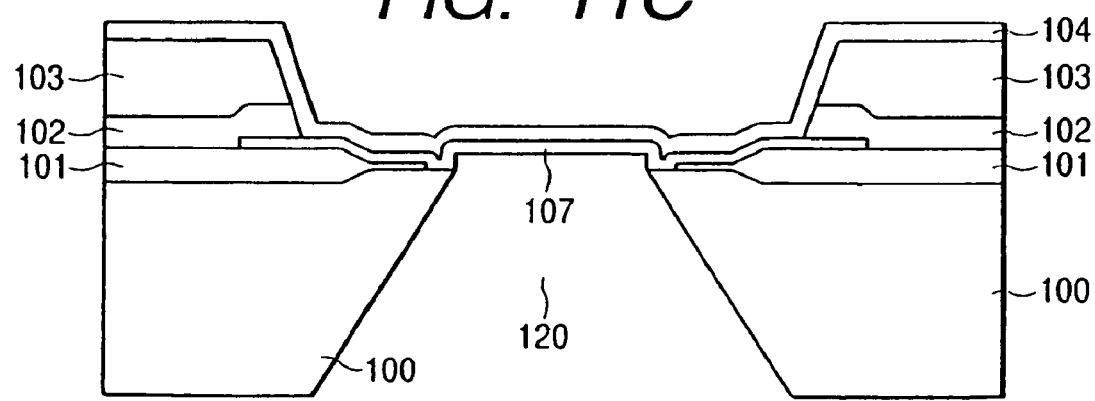

The following will describe a liquid discharge apparatus according to the present invention, i.e., an ink jet recording apparatus provided with the ink jet recording head as described above. FIG. 7 is a schematic perspective view showing a configuration of such an ink jet recording apparatus. The apparatus herein is constructed using a head cartridge 51 of the structure in which the ink jet recording head 52 is integrated with an ink tank 53 as a container for accommodating ink.

The head cartridge 51 is replaceably (detachably) mounted on a carriage 54. The carriage 54 moves back and forth in the directions X, Y (the main scanning directions) in the drawing, along a carriage drive shaft 55 and a guide shaft 56, through rotation of the carriage drive shaft (lead screw) 55. Namely, a spiral groove 57 is formed in the carriage drive shaft 55, and the carriage 54 is provided with a pin (not shown) engaging the spiral groove 57. With rotation of the carriage drive shaft 55, the carriage 54 moves in parallel along the spiral groove 57. The head cartridge 51 is fixed at a predetermined position relative to the carriage 54 by positioning means, and is electrically connected through contacts to a flexible cable connecting the carriage 54 with a control circuit on the main body side of the recording apparatus.

In FIG. 7, opposite the carriage 54 and within the moving range of the carriage 54, a conveying roller 59 for holding and feeding (conveying) a recording medium 58 is rotatably supported in parallel with the carriage drive shaft 55. In the illustrated example, the conveying roller 59 also serves as a platen (platen roller). The conveying roller 59 is rotatably driven by a conveying motor 60. The recording medium 58 is pressed against the conveying roller (platen roller) 59 throughout the moving (main scanning) direction of the carriage 54 by a sheet presser 61, at the recording position.

A driving motor 62 is mounted on the main body side of the recording apparatus, and the carriage drive shaft (lead screw) 55 is rotatably driven thereby through driving force transmission gears 63, 64. The carriage 54 is caused to move in the X or Y directions by rotating the carriage drive shaft 55 forward or backward through forward or backward rotation of the driving motor 62.

A home position of the carriage 54 is set at a predetermined position (a position on the left side in the drawing) outside of the recording region and within the moving range of the carriage 54. A photocoupler 65 is located in the vicinity of the home position. When the carriage 54 arrives at the home position, the photocoupler 65 detects entry of a lever 66 disposed on the carriage 54, thereby detecting the arrival of the carriage 54 at the home position. Namely, the photocoupler 65 is used as a detecting means (sensor) for controlling various operations of the recording apparatus, including an operation of switching the rotating direction of the driving motor 62 so as to reverse the carriage moving direction upon the arrival of the recording head 52 at the home position, an operation of starting a recovery operation in order to eliminate or prevent plugging of the discharge openings of the recording head 52, and so on.

A cap 68 for covering (hermetically closing) the discharge opening surface of the recording head 52 in the head cartridge 51 is provided at the home position. The cap 68 is supported by a cap holder 69 so as to be movable in directions in which it is brought into close fit with the discharge opening surface and in which it is retracted away therefrom. A blade (cleaning member) 70 for wiping (cleaning) the discharge opening surface is located between the cap 68 and the recording region. This blade 70 is held by a blade holder 72 supported by a body support plate 71 so as to be movable between an advanced position where it can wipe the discharge opening surface and a retracted position where it is out of contact with the discharge opening surface.

In addition to the form of the blade 70, the cleaning means for the discharge opening surface can take any one of various forms as long as it is a member capable of removing foreign particles. The operations including the capping of the discharge opening surface, the cleaning of the discharge opening surface, etc. are carried out with the carriage 54 being stationary or in motion at the corresponding position(s) and at predetermined timings through the action of the spiral groove 57 of the carriage drive shaft 55 when the carriage 54 comes to the region on the home position side.

The above discussion described the embodiments of the present invention as examples in which a substrate for an ink jet recording head was formed, but it is noted that the present invention is by no means intended to be limited to such examples and is generally applicable to formation of a through hole in a structure such as a silicon substrate or the like. For example, it is also applicable to the production of so-called micromachines or the like.

What is claimed is:

1. A structure comprising a semiconductor substrate, a silicon oxide film and a silicon nitride film provided on a first principal surface of said semiconductor substrate, an element provided between said silicon oxide film and said silicon nitride film, and a through hole penetrating said semiconductor substrate, said silicon oxide film, and said silicon nitride film, wherein said silicon nitride film is formed in contact with an upper surface of said silicon oxide film at least at a portion of said semiconductor substrate adjacent to said through hole, and said element provided between said silicon oxide film and said silicon nitride film comprises a heating resistor and a MOS transistor for causing a current to flow into said heating resistor.

2. The structure according to claim 1, wherein said semiconductor substrate is a silicon substrate.

3. The structure according to claim 1, further comprising a circuit element on said first principal surface.

4. A liquid discharge head comprising:
a recording head substrate, said recording head substrate comprising a semiconductor substrate, a silicon oxide film and a silicon nitride film provided on a first principal surface of said semiconductor substrate, a heating resistor and a MOS transistor for causing a current to flow into said heating resistor provided between said silicon oxide film and said silicon nitride film, and a supply opening penetrating said semiconductor substrate, said silicon oxide film, and said silicon nitride film and adapted to supply a liquid; and
a discharge opening provided so as to face said heating resistor,
wherein said silicon nitride film is formed so as to be in contact with an upper surface of said silicon oxide film at least at a portion of said semiconductor substrate adjacent to said supply opening.

5. The liquid discharge head according to claim 4, wherein said semiconductor substrate is a silicon substrate.

6. The liquid discharge head according to claim 4, further comprising a circuit element for driving said heating resistor, said circuit element being disposed on said first principal surface.

7. A liquid discharge apparatus comprising the liquid discharge head as set forth in claim 4, and a container for accommodating the liquid supplied through said supply opening.

* * * * *

UNITED STATES PATENT AND TRADEMARK OFFICE
CERTIFICATE OF CORRECTION

PATENT NO. : 7,018,020 B2  Page 1 of 1
APPLICATION NO. : 10/270650
DATED : March 28, 2006
INVENTOR(S) : Yukihiro Hayakawa et al.

It is certified that error appears in the above-identified patent and that said Letters Patent is hereby corrected as shown below:

Title page, item (75) INVENTORS
Line 2, "Genzo Monma" should read --Genzo Momma--.

COLUMN 8
Line 2, "as" should be deleted.
Line 3, "example" should read --example of--.

Signed and Sealed this

Twenty-seventh Day of May, 2008

JON W. DUDAS
*Director of the United States Patent and Trademark Office*